(12) United States Patent
Kim et al.

(10) Patent No.: US 9,608,238 B2
(45) Date of Patent: Mar. 28, 2017

(54) DISPLAY PANEL INCLUDING MULTILAYER DIFFUSION BARRIER

(71) Applicant: Samsung Display Co., Ltd., Yongin-si (KR)

(72) Inventors: Jintaek Kim, Suwon-si (KR); Jong Yun Kim, Yongin-si (KR); Cheolho Yu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/044,679

(22) Filed: Feb. 16, 2016

(65) Prior Publication Data

US 2016/0164048 A1     Jun. 9, 2016

Related U.S. Application Data

(62) Division of application No. 14/100,525, filed on Dec. 9, 2013, now Pat. No. 9,299,951.

(30) Foreign Application Priority Data

Jul. 19, 2013    (KR) .................. 10-2013-0085522

(51) Int. Cl.
*H01L 29/08*    (2006.01)
*H01L 51/56*    (2006.01)
(Continued)

(52) U.S. Cl.
CPC .......... *H01L 51/56* (2013.01); *H01L 27/3244* (2013.01); *H01L 51/003* (2013.01);
(Continued)

(58) Field of Classification Search
CPC ...... H01L 27/3258; H01L 27/32; H01L 51/56
(Continued)

(56) References Cited

U.S. PATENT DOCUMENTS 5,747,830 A    5/1998   Okita
7,087,537 B2   8/2006   Joshi et al.
(Continued)

FOREIGN PATENT DOCUMENTS

JP    2004309931    11/2004
KR    1020100047984    5/2010
(Continued)

OTHER PUBLICATIONS

Notice of Allowance dated Jan. 13, 2016, in U.S. Appl. No. 14/100,525.
(Continued)

*Primary Examiner* — Matthew Gordon
(74) *Attorney, Agent, or Firm* — H.C. Park & Associates, PLC

(57) ABSTRACT

Disclosed is a display panel including: a flexible substrate; a buffer layer disposed on the flexible substrate; a pixel disposed on the buffer layer and comprising a thin film transistor and an image device connected to the thin film transistor; a barrier layer disposed on the flexible substrate to protect the pixel from a substance from the flexible substrate; and a diffusion prevention layer disposed between the barrier layer and the buffer layer and configured to prevent hydrogen generated from the barrier layer from being diffused into the thin film transistor.

8 Claims, 9 Drawing Sheets

(51) Int. Cl.
  *H01L 51/52* (2006.01)
  *H01L 27/32* (2006.01)
  *H01L 51/00* (2006.01)

(52) U.S. Cl.
  CPC .... *H01L 51/5253* (2013.01); *H01L 2227/323* (2013.01); *H01L 2227/326* (2013.01); *H01L 2251/301* (2013.01); *H01L 2251/303* (2013.01); *H01L 2251/5338* (2013.01)

(58) Field of Classification Search
  USPC ..................................... 257/40, 59; 438/149
  See application file for complete search history.

(56) References Cited

U.S. PATENT DOCUMENTS

| | | | |
|---|---|---|---|
| 2005/0202662 A1* | 9/2005 | Joshi | H01L 21/02164 438/585 |
| 2005/0287758 A1 | 12/2005 | Kim | |
| 2007/0273280 A1 | 11/2007 | Kim et al. | |
| 2011/0017997 A1* | 1/2011 | Kamath | H01L 29/78603 257/66 |
| 2012/0127578 A1* | 5/2012 | Bright | G02B 1/116 359/585 |
| 2013/0075739 A1* | 3/2013 | Loy | H01L 21/6835 257/60 |

FOREIGN PATENT DOCUMENTS

| | | |
|---|---|---|
| KR | 1020100048035 | 5/2010 |
| KR | 1020120012891 | 2/2012 |

OTHER PUBLICATIONS

Final Office Action dated Oct. 22, 2015, in U.S. Appl. No. 14/100,525.
Non-Final Office Action dated May 11, 2015, in U.S. Appl. No. 14/100,525.
Abe et al., "Oxidation and Reduction Characteristics of Sputter-Deposited Cu Thin Films," Journal of the Electrochemical Society, Jun. 16, 2005, pp. G577-81, vol. 152.
A. A. Bergh, "Atomic Hydrogen as a Reducing Agent," The Bell System Technical Journal, Feb. 1965, pp. 261-271.

* cited by examiner

DISPLAY PANEL INCLUDING MULTILAYER DIFFUSION BARRIER

CROSS-REFERENCE TO RELATED APPLICATION

This application is a divisional of U.S. patent application Ser. No. 14/100,525 filed on Dec. 9, 2013 which claims priority from and the benefit of Korean Patent Application No. 10-2013-0085522, filed on Jul. 19, 2013, which is hereby incorporated by reference for all purposes as if fully set forth herein.

BACKGROUND

Field

The present disclosure relates to a display panel and a method of manufacturing the same. More particularly, the present disclosure relates to a flexible display panel and a method of manufacturing the flexible display panel.

Discussion of the Background

In general, a display panel includes a base substrate, signal lines disposed on the base substrate, and pixels connected to the signal lines. In addition, a display panel typically includes an insulating layer disposed on the base substrate. The signal lines and the pixels are disposed on the insulating layer.

Display panels can be classified into flat display panels and flexible display panels depending on characteristics of the base substrate. A flat display panel generally includes a rigid base substrate, e.g., a glass substrate, while a flexible display panel includes a flexible base substrate, e.g., a plastic substrate.

SUMMARY

Various exemplary embodiments of the present disclosure provide a display panel capable of reducing defects.

Various exemplary embodiments of the present disclosure provide a method of manufacturing the display panel.

One exemplary embodiment of the present disclosure provides a display panel including: a flexible substrate; a buffer layer disposed on the flexible substrate; a pixel disposed on the buffer layer and comprising a thin film transistor and an image device connected to the thin film transistor; a barrier layer disposed on the flexible substrate to protect the pixel from a substance from the flexible substrate; and a diffusion prevention layer disposed between the barrier layer and the buffer layer and configured to prevent hydrogen generated from the barrier layer from being diffused into the thin film transistor.

One exemplary embodiment of the present disclosure provides a method of manufacturing a display panel including: disposing a flexible substrate on a sacrificial substrate; forming a barrier layer on the flexible substrate; forming a diffusion prevention layer on the barrier layer, the diffusion prevention layer comprising a metal oxide and a metal reduced from the metal oxide; forming a buffer layer on the diffusion prevention layer; and separating the plastic substrate from the sacrificial substrate.

One exemplary embodiment of the present disclosure provides a display panel comprising: a plastic substrate; a barrier layer disposed on the plastic substrate and configured to prevent an impure substance from the plastic substrate from migrating; a diffusion prevention layer disposed on the barrier layer configured to prevent hydrogen generated from the barrier layer from being diffused; a buffer layer disposed on the diffusion prevention layer; and a pixel disposed on the buffer layer and comprising a thin film transistor and an image device connected to the thin film transistor.

In accordance with one exemplary embodiment, a manufacturing method of the display panel may not include a dehydration process performed at a high temperature, and thus the plastic substrate may be prevented from being deformed. Although the manufacturing method of the display panel does not include a dehydration process, the pixel may be protected by a diffusion prevention layer from the hydrogen generated from a barrier layer. It is to be understood that both the foregoing general description and the following detailed description are exemplary and explanatory and are intended to provide further explanation of the invention as claimed.

BRIEF DESCRIPTION OF THE DRAWINGS

The above and other advantages of the present disclosure will become readily apparent by reference to the following detailed description when considered in conjunction with the accompanying drawings.

DETAILED DESCRIPTION OF THE ILLUSTRATED EMBODIMENTS

Figure 1:
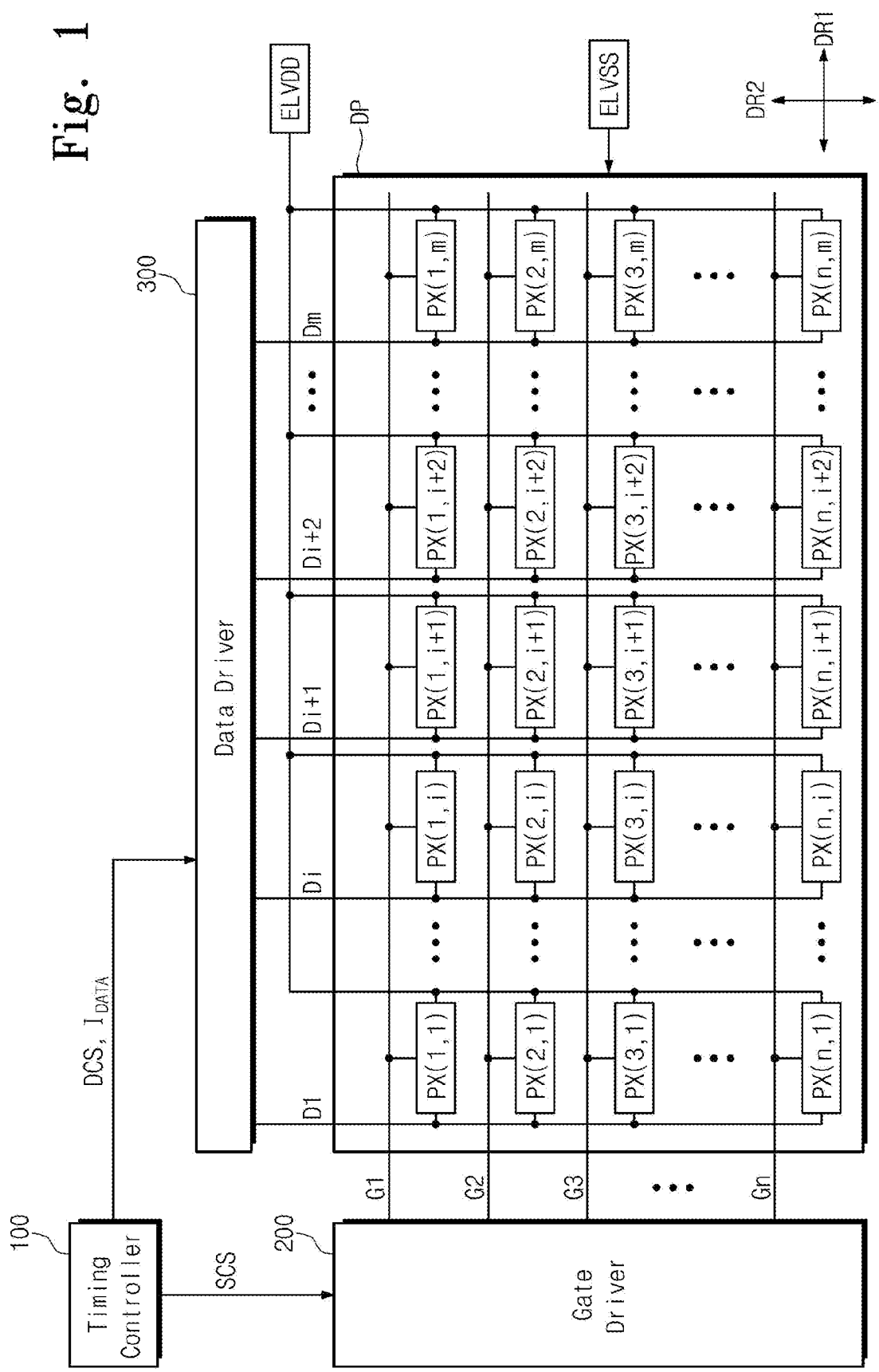
FIG. 1 is a block diagram showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various exemplary embodiments of the present invention will be explained in detail with reference to the accompanying drawings.

Figure 2:
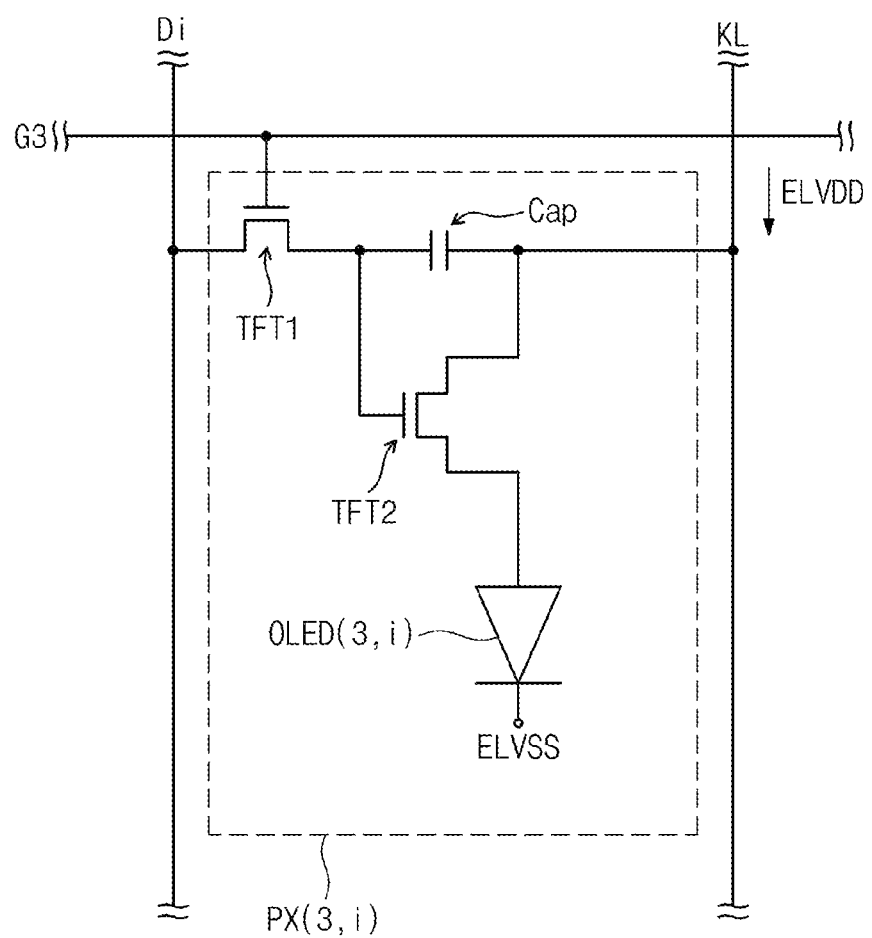
FIG. 2 is an equivalent circuit diagram showing a pixel according to an exemplary embodiment of the present disclosure.

FIG. 1 is a block diagram showing a display device according to an exemplary embodiment of the present disclosure and FIG. 2 is an equivalent circuit diagram showing a pixel according to an exemplary embodiment of the present disclosure.

Referring to FIG. 1, the display device includes a display panel DP, a timing controller 100, a gate driver 200, and a data driver 300.

The display panel DP includes a base substrate (not shown), signal lines disposed on the base substrate, and a plurality of pixels PX(1, 1) to PX(n, m) connected to the signal lines. The signal lines include a plurality of gate lines G1 to Gn and a plurality of data lines D1 to Dm. The gate lines G1 to Gn extend in a first direction DR1 and arranged in a second direction DR2 crossing the first direction DR1. The data lines D1 to Dm are insulated from the gate lines G1 to Gn while crossing the gate lines G1 to Gn.

The display panel DP is flexible, and thus the display panel DP may be folded or bent. The base substrate may be, but is not limited to, a flexible plastic substrate. The plastic substrate may include polyimide, which has high impact resistance and high heat resistance.

In the present exemplary embodiment, an organic light emitting display panel will be described as the display panel DP, but the display panel DP should not be limited to the organic light emitting display panel. That is, the display panel DP may be any suitable flexible display panel, for instance, an electrophoretic display panel or an electrowetting display panel.

Each of the pixels PX(1, 1) to PX(n, m) includes a thin film transistor and an image device. The thin film transistor applies an electrical signal to the image device, and the operation of the image device is controlled in response to the electrical signal. The organic light emitting display panel includes an organic light emitting diode as the image device.

Different display panels include different image devices. In detail, an electrophoretic display panel includes two electrodes and electrophoretic particles as the image device. An electrowetting display panel includes two electrodes and an electronic ink as the image device. The electrophoretic display panel and the electrowetting display panel respectively control the electrophoretic particles and the electronic ink in accordance with an electric field formed between the two electrodes.

Hereinafter, the pixel of the organic light emitting display panel will be described in detail with reference to FIG. 2. Here, the pixel PX(3, i) connected to a third gate line G3 and an i-th data line Di will be described in detail as a representative example.

Referring to FIG. 2, the pixel PX(3, i) includes at least one transistor, at least one capacitor, and an organic light emitting diode. The pixel PX(3, i) is turned on in response to a corresponding gate signal. The pixel PX(3, i) generates light corresponding to a current applied to the organic light emitting diode in response to a data signal.

In more detail, the pixel PX(3, i) includes a first transistor TFT1, a second transistor TFT2, a capacitor Cap, and an organic light emitting diode OLED(3, i). The first transistor TFT1 includes a control electrode connected to the third gate line G3, an input electrode connected to the i-th data line Di, and an output electrode. The first transistor TFT1 outputs the data signal applied to the i-th data line Di in response to the gate signal applied to the third gate line G3.

In accordance with one exemplary embodiment, the capacitor Cap may include a first electrode connected to the first transistor TFT1 and a second electrode applied with a first source voltage ELVDD. The capacitor Cap is charged with electric charges corresponding to the difference between the voltage corresponding to the data signal from the first transistor TFT1 and the first source voltage ELVDD.

In accordance with one exemplary embodiment, the second transistor TFT2 may include a control electrode connected to the output electrode of the first transistor TFT1 and the first electrode of the capacitor Cap, an input electrode applied with the first source voltage ELVDD, and an output electrode. The output electrode of the second transistor TFT2 is connected to the organic light emitting diode OLED(3, i). The second transistor TFT2 controls a driving current flowing through the organic light emitting diode OLED(3, i) in response to the amount of the electric charges charged in the capacitor Cap.

In accordance with one exemplary embodiment, the organic light emitting diode OLED(3, i) may include a first electrode (e.g., an anode) connected to the second transistor TFT2 and a second electrode (e.g., a cathode) applied with a second source voltage ELVSS. In addition, the organic light emitting diode OLED(3, i) includes an organic light emitting layer (not shown) disposed between the first electrode and the second electrode. The organic light emitting diode OLED (3, i) emits the light during the turn-on period of the second transistor TFT.

Referring back to FIG. 1, the timing controller 100 receives input image signals (not shown) and outputs image data $I_{DATA}$ obtained by converting the input image signals according to the operation mode of the organic light emitting display panel DP and various control signals SCS and DSC.

The gate driver 200 receives a gate driving control signal SCS from the timing controller 100. The gate driver 200 generates a plurality of gate signals in response to the gate driving control signal SCS. The gate signals are sequentially applied to the gate lines G1 to Gn.

The data driver 300 receives a data driving control signal DCS and the converted image data $I_{DATA}$ from the timing controller 100. The data driver 300 generates a plurality of data signals on the basis of the data driving control signal DCS and the converted image data $I_{DATA}$. The data signals are applied to the data lines D1 to Dm.

Figure 3:
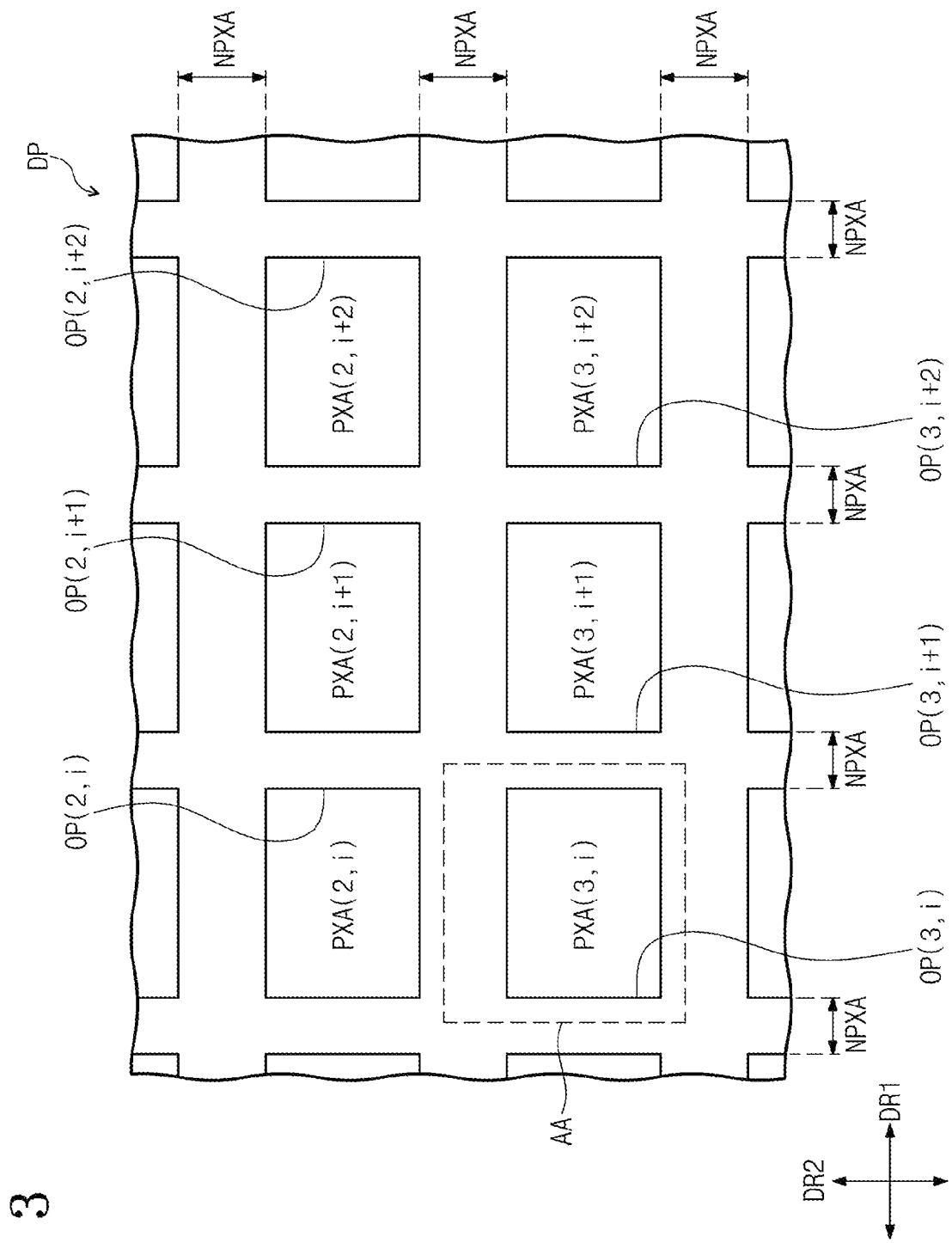
FIG. 3 is a plan view showing a portion of a display panel according to an exemplary embodiment of the present disclosure.

FIG. 3 is a plan view showing a portion of the organic light emitting display panel shown in FIG. 1.

Referring to FIG. 3, the organic light emitting display panel DP includes a plurality of light emitting areas PXA(2, i) to PXA(3, i+2) and a non-light emitting area NPXA surrounding the light emitting areas PXA(2, i) to PXA(3, i+2).

In accordance with one exemplary embodiment, the light emitting areas PXA(2, i) to PXA(3, i+2) and the non-light emitting area NPXA may be partitioned by a pixel definition layer PDL as will be described later. The light emitting areas PXA(2, i) to PXA(3, i+2) are defined by and overlapped with a plurality of openings OP(2, i) to OP(3, i+2) formed through the pixel definition layer PDL. The non-light emitting area NPXA is defined by and overlapped with the pixel definition layer PDL.

The pixels PX(2, i) to PX(3, i+2) (referring to FIG. 1) are disposed in the light emitting areas PXA(2, i) to PXA(3, i+2), respectively. The organic light emitting diodes of the pixels PX(2, i) to PX(3, i+2) are exposed through the openings OP(2, i) to OP(3, i+2). The first thin film transistor TFT1 (referring to FIG. 2), the second thin film transistor TFT2 (referring to FIG. 2), and the capacitor Cap of the pixels PX(2, i) to PX(3, i+2) are disposed in the non-light emitting area NPXA. In addition, the gate lines G1 to Gn and the data lines D1 to Dm are disposed in the non-light emitting area NPXA.

Figure 4:
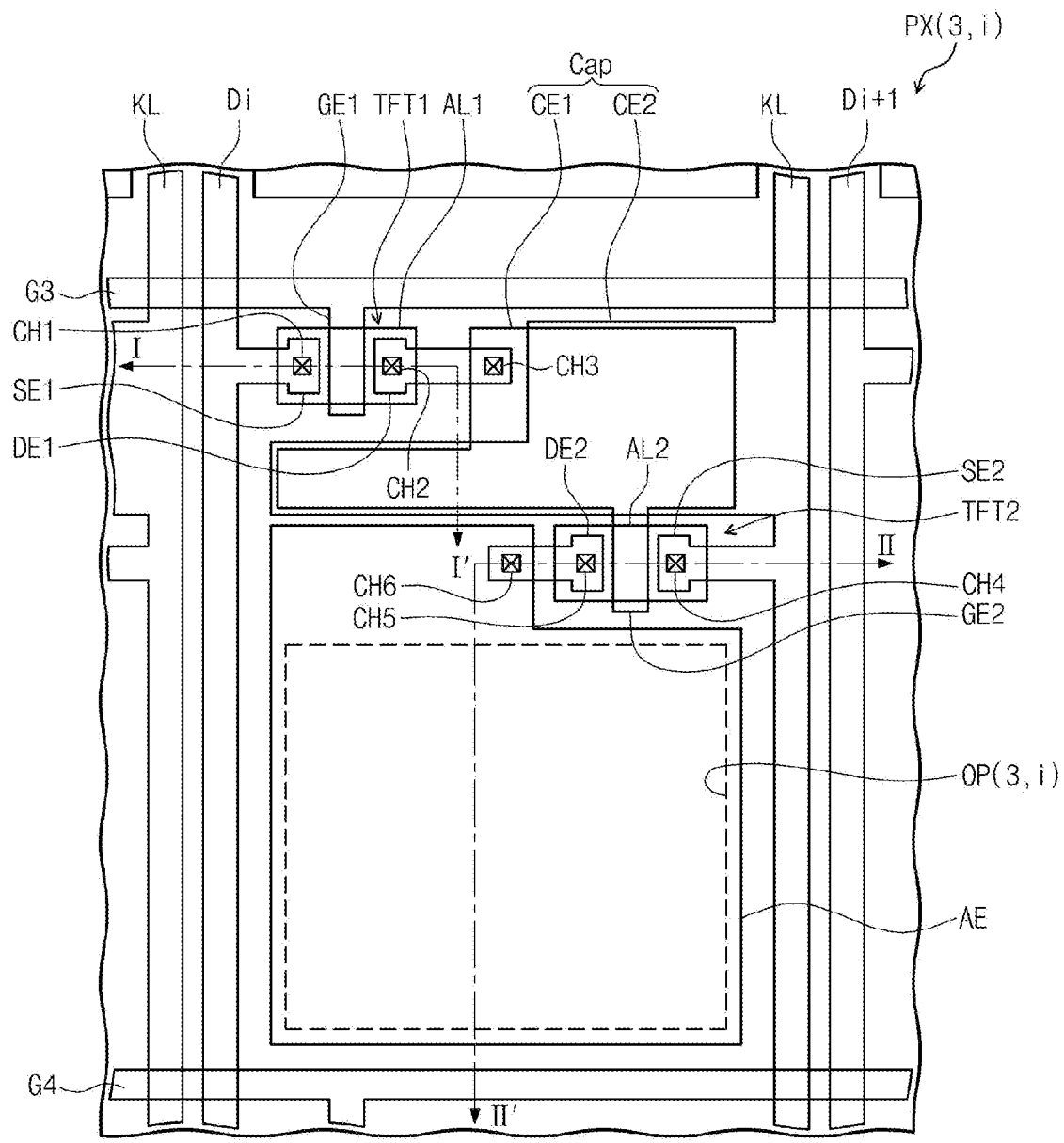
FIG. 4 is a layout of a pixel according to an exemplary embodiment of the present disclosure.
Figure 5:
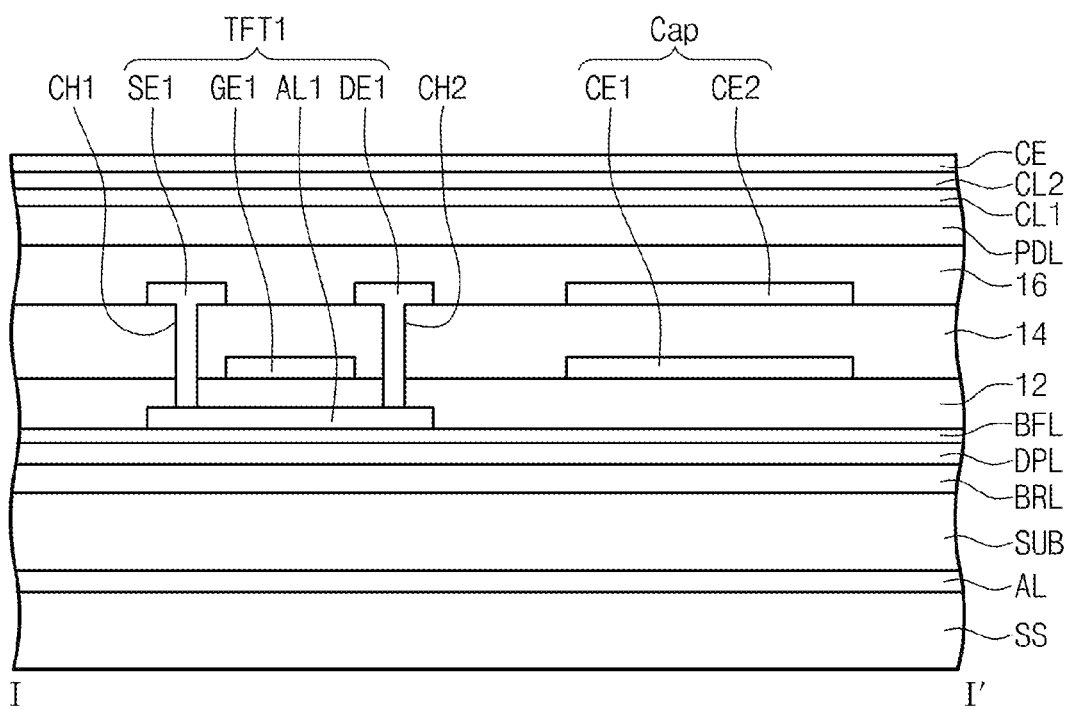
FIG. 5 is a cross-sectional view taken along a line I-I' of FIG. 4.
Figure 6:
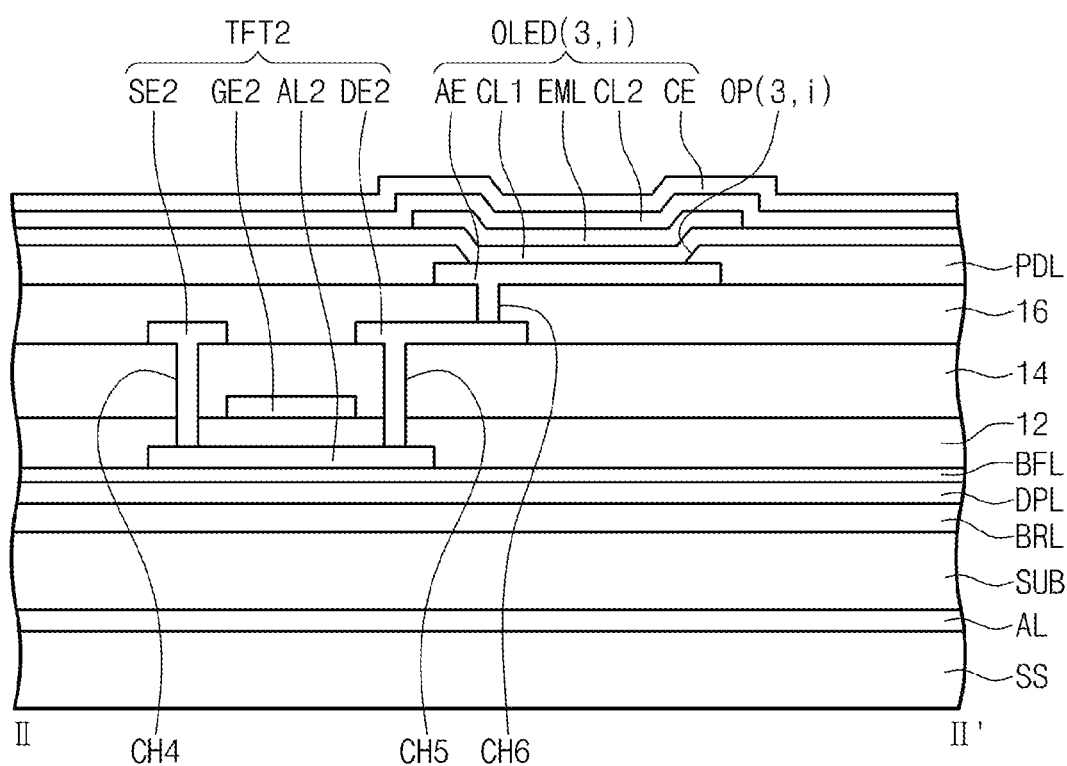
FIG. 6 is a cross-sectional view taken along a line II-II' of FIG. 4.

FIG. 4 is a layout of the pixel PX(3, i) according to an exemplary embodiment of the present disclosure, FIG. 5 is a cross-sectional view taken along a line I-I' of FIG. 4, and FIG. 6 is a cross-sectional view taken along a line of FIG. 4.

Referring to FIG. 4, the third gate line G3, a fourth gate line G4, the i-th data line Di, and an (i+1)th data line Di+1 are disposed on the plastic substrate SUB. The third gate line G3 and the fourth gate line G4 are disposed on the same layer, and the i-th data line Di, and the (i+1)th data line Di+1 are disposed on the same layer. The third and fourth gate lines G3 and G4 are insulated from the i-th and (i+1)th data lines Di and Di+1 while crossing the i-th and (i+1)th data lines Di and Di+1.

In addition, a source voltage line KL is disposed on the plastic substrate SUB to receive the first source voltage ELVDD. The source voltage line KL may be disposed, for example, on the same layer as the i-th and (i+1)th data lines Di and Di+1.

Referring to FIGS. 5 and 6, a barrier layer BRL is disposed on the plastic substrate SUB. In addition, a diffusion prevention layer DPL is disposed on the barrier layer BRL, and a buffer layer BFL is disposed on the diffusion prevention layer DPL. The first thin film transistor TFT1, the second thin film transistor TFT2, the capacitor Cap, and the organic light emitting diode OLED are disposed on the buffer layer BFL.

A semiconductor pattern AL1 (hereinafter, referred to as the first semiconductor pattern) of the first thin film transistor TFT1 and a semiconductor pattern AL2 (hereinafter, referred to as the second semiconductor pattern) of the second thin film transistor TFT2 are disposed on the buffer layer BFL. The first semiconductor pattern AL1 and the second semiconductor pattern AL2 may include amorphous silicon formed at a low temperature. Alternatively, one or both of the first semiconductor pattern AL1 and the second semiconductor pattern AL2 may include other semiconductor material, such as, for example, polycrystalline silicon or an oxide semiconductor.

In accordance with one exemplary embodiment, a first insulating layer 12 is disposed on the buffer layer BFL to cover the first and second semiconductor patterns AL1 and AL2. The first insulating layer 12 may include an organic layer and/or an inorganic layer. The first insulating layer 12 may include a plurality of thin film layers.

The control electrode GE1 (hereinafter, referred to as the first control electrode) of the first thin film transistor TFT1 and the control electrode GE2 (hereinafter, referred to as the second control electrode) of the second thin film transistor TFT2 are disposed on the first insulating layer 12.

The first electrode CE1 of the capacitor Cap is disposed on the first insulating layer 12. In accordance with one exemplary embodiment, the first electrode CE1 may be formed, for instance, by the same photolithography process as used to form the third gate line G3 and the fourth gate line G4. Therefore, the first electrode CE1 may include the same material as that of the third and fourth gate lines G3 and G4.

In accordance with one exemplary embodiment, a second insulating layer 14 may be disposed on the first insulating layer 12 to cover the first control electrode GE1, the second control electrode GE2, and the first electrode CE1. The second insulating layer 14 may include an organic layer and/or an inorganic layer. Further, the second insulating layer 14 may include a plurality of thin film layers.

In accordance with one exemplary embodiment, the input electrode SE1 (hereinafter, referred to as the first input electrode) and the output electrode DE1 (hereinafter, referred to as the first output electrode) of the first thin film transistor TFT1 may be disposed on the second insulating layer 14. In addition, the input electrode SE2 (hereinafter, referred to as the second input electrode) and the output electrode DE2 (hereinafter, referred to as the second output electrode) of the second thin film transistor TFT2 may be disposed on the second insulating layer 14.

The first input electrode SE1 is branched from the i-th data line Di, and the second input electrode SE2 is branched from the source voltage line KL.

The second electrode CE2 of the capacitor Cap is disposed on the second insulating layer 14. The second electrode CE2 may be formed, for instance, by the same photolithography process as used to form the i-th data line Di, and thus the second electrode CE2 may include the same material as that of the i-th data line Di.

The first input electrode SE1 and the first output electrode DE1 are connected to the first semiconductor pattern AL1 through a first contact hole CH1 and a second contact hole CH2, respectively, which are formed through the first insulating layer 12 and the second insulating layer 14. The first output electrode DE1 is connected to the first electrode CE1 through a third contact hole CH3 formed through the second insulating layer 14. The second input electrode SE2 and the second output electrode DE2 are connected to the second semiconductor pattern AL2 through a fourth contact hole CH4 and a fifth contact hole CH5, respectively, which are formed through the first insulating layer 12 and the second insulating layer 14. Although FIGS. 5 and 6 show a top-gate structure according to one exemplary embodiment, one of ordinary skill in the art will appreciate that the first thin film transistor TFT1 and the second thin film transistor TFT2 may alternatively have a bottom-gate structure.

In accordance with one exemplary embodiment, a third insulating layer 16 is disposed on the second insulating layer 14 to cover the first input electrode SE1, the first output electrode DE1, the second input electrode SE2, and the second output electrode DE2. The third insulating layer 16 may include an organic layer and/or an inorganic layer. The third insulating layer 16 may include a plurality of thin film layers.

The pixel definition layer PDL and the organic light emitting diode OLED(3, i) are disposed on the third insulating layer 16. The organic light emitting diode OLED(3, i) includes an anode AE, a first common layer CL1, an organic light emitting layer EML, a second common layer CL2, and a cathode CE, which may be sequentially stacked. The anode AE is connected to the second output electrode DE2 through a sixth contact hole CH6 formed through the third insulating layer 16. The positions of the anode AE and the cathode CE may be changed with each other according to the light emitting direction of the organic light emitting diode OLED (3, i).

In accordance with one exemplary embodiment, the anode AE may be disposed on the third insulating layer 16. The anode AE is exposed through the opening OP(3, i) of the pixel definition layer PDL. The first common layer CL1 is disposed on the anode AE. The first common layer CL1 may be disposed not only on the light emitting area PXA(3, i), but also on the other light emitting areas PXA(2, i) to PXA(3, i+2) (referring to FIG. 3) and the non-light emitting area NPXA. That is, the first common layer CL1 may be disposed on the entire surface of the plastic substrate SUB. The first common layer CL1 may include a hole injection layer. The first common layer CL1 may further include a hole transport layer.

In accordance with one exemplary embodiment, the organic light emitting layer EML may be disposed on the first common layer CL1. The organic light emitting layer EML may be disposed only in an area corresponding to the opening OP(3, i). The second common layer CL2 is disposed on the organic light emitting layer EML. The second common layer CL2 may be disposed on the entire surface of the plastic substrate SUB as the first common layer CL1. The second common layer CL2 may include an electron injection layer. The second common layer CL2 may further include an electron transport layer. The cathode CE is disposed on the second common layer CL2. The cathode CE may be disposed on the entire surface of the plastic substrate SUB.

The display panel DP may further include another substrate facing the plastic substrate SUB. Another substrate may be a sealing substrate to seal the pixels PX(1, 1) to PX(n, m).

Referring to FIG. 5 and FIG. 6, the plastic substrate SUB is disposed on a surface of a sacrificial substrate SS. An adhesive layer AL is disposed between the sacrificial substrate SS and the plastic substrate SUB. The adhesive layer AL and the sacrificial substrate SS are temporarily used in the manufacturing process of the display panel. That is, the adhesive layer AL and the sacrificial substrate SS do not constitute any part of the display panel after the display panel is manufactured. The adhesive layer AL and the sacrificial substrate SS are separated from the plastic substrate SUB after a process of manufacturing for the display panel is finished.

Figure 7:
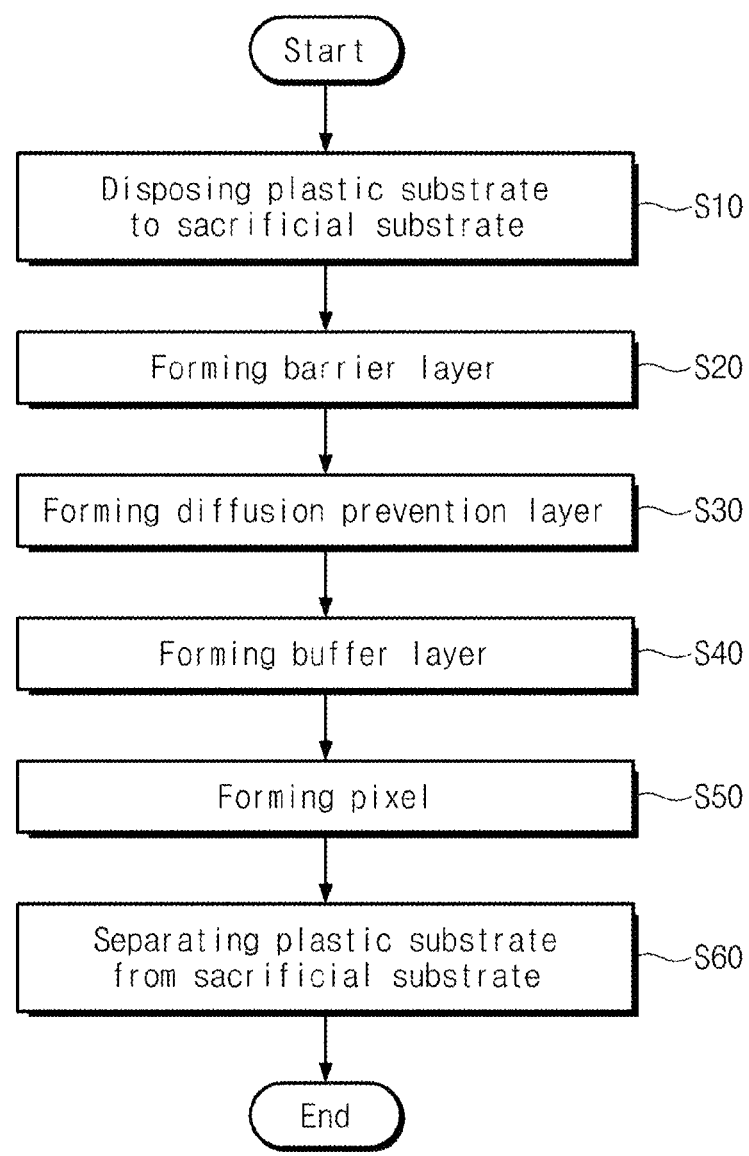
FIG. 7 is a flowchart showing a method of manufacturing a display panel according to an exemplary embodiment of the present disclosure.
Figure 8:
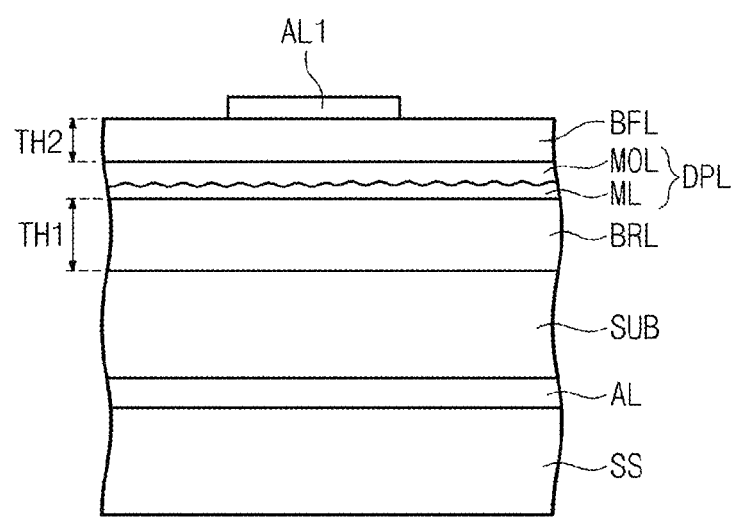
FIG. 8 is a partially enlarged view showing a portion of the pixels shown in FIG. 5.

FIG. 7 is a flowchart showing a method of manufacturing the display panel according to an exemplary embodiment of the present disclosure, and FIG. 8 is a partially enlarged view showing a portion of the pixels shown in FIG. 5. Hereinafter, the barrier layer BRL, the diffusion prevention layer DPL, and the buffer layer BFL will be described in detail with reference to FIGS. 7 and 8.

First, the plastic substrate SUB is disposed on a surface of a sacrificial substrate (S10). The sacrificial substrate is temporarily used in the manufacturing process of the display panel. For example, the plastic substrate SUB is attached to the surface of a sacrificial substrate SUB using a lamination process.

In accordance with one exemplary embodiment, the manufacturing process of the display panel may be performed while the plastic substrate SUB is disposed on the surface of the sacrificial substrate. The sacrificial substrate supports the bendable plastic substrate. The sacrificial substrate may be, but is not limited to, a glass substrate, for instance.

Then, the barrier layer BRL is formed on a surface of the plastic substrate SUB (S20). The barrier layer BRL protects the pixel PX(3, i) (referring to FIG. 4) from foreign, impure substances out of the plastic substrate SUB. Foreign substances may come from the outside or be generated when the plastic substrate SUB is thermally decomposed. The barrier layer BRL may prevent impurities, which may be created by the thermal decomposition of the plastic substrate SUB, from migrating into other adjacent layers, possibly creating defects on those layers.

In accordance with one exemplary embodiment, the barrier layer BRL may include at least one of silicon oxide or silicon nitride. The barrier layer BRL may include plural thin film layers. For instance, the barrier layer BRL may include a silicon oxide layer and a silicon nitride layer, which are alternately stacked on each other. The barrier layer BRL may be formed by any suitable method, for instance, a chemical vapor deposition method, a heat deposition method, or a sputtering method.

After that, the diffusion prevention layer DPL may be formed on the barrier layer BRL (S30). The diffusion prevention layer DPL prevents a hydrogen gas generated from the barrier layer BRL from being diffused to the first thin film transistor TFT1 (referring to FIG. 5) and the second thin film transistor TFT2 (referring to FIG. 6).

The silicon oxide and the silicon nitride for the barrier layer BRL usually contain hydrogen. During subsequent processes, the hydrogen decomposed from the barrier layer BRL may become a foreign impure substance. In particular, when the hydrogen penetrates into the first semiconductor pattern AL1 and the second semiconductor pattern AL2, the mobility of electrons may be lowered in the first thin film transistor TFT1 and the second thin film transistor TFT2.

The manufacturing method of the display panel according to one exemplary embodiment may not include a dehydration process right after the barrier layer BRL is formed. This is because that the plastic substrate SUB may be deformed by the dehydration process performed at a temperature of about 450 degrees Celsius.

In accordance with one exemplary embodiment, the dehydration process may be replaced with the diffusion prevention layer DPL. Although the dehydration process is not performed, the hydrogen decomposed from the barrier layer BRL is removed by the diffusion prevention layer DPL before the hydrogen reaches the first thin film transistor TFT1 and the second thin film transistor TFT2. That is, the hydrogen is combined with oxygen from the diffusion prevention layer DPL and then is discharged in the form of vapor.

In accordance with one exemplary embodiment, the diffusion prevention layer DPL may include metal oxide and metal reduced from metal oxide material. For instance, the diffusion prevention layer DPL may include copper oxide oxidized in an oxygen atmosphere and copper reduced in a hydrogen atmosphere.

The concentration of the reduced metal is increased as the position at which the concentration is measured is closer to the barrier layer BRL in the thickness direction (i.e., vertical direction) of the diffusion prevention layer DPL. This is because the likelihood of reactions between the diffusion prevention layer DPL and the hydrogen generated from the barrier layer BRL becomes higher as it is closer to the barrier layer BRL.

As shown in FIG. 8, the diffusion prevention layer DPL may include the metal oxide layer MOL and the metal layer ML. The diffusion prevention layer DPL may be formed, for example, using the following process. A metal layer is formed on the barrier layer BRL, for instance, by a sputtering method. The metal layer may be oxidized in an oxygen atmosphere at a temperature of about 200 degrees Celsius to form a metal oxide layer. A portion of the metal oxide layer is reduced to the metal layer at a temperature of about 300 degrees Celsius by the hydrogen decomposed from the barrier layer BRL. Thus, the diffusion prevention layer DPL including the metal oxide layer MOL and the metal layer ML is formed.

In accordance with one exemplary embodiment, the metal layer ML formed by reducing the metal oxide may be disposed under the metal oxide layer MOL to make contact with the barrier layer BRL. The metal layer ML has a thickness determined by the reduction degree, but the metal layer ML may have different thicknesses depending on areas thereof since the reduction degree may be different depending on areas of the diffusion prevention layer DPL. The thickness of the diffusion prevention layer DPL is about 10 nm to 90 nm.

The metal layer ML shields charges remaining in the plastic substrate SUB to prevent the charges in the plastic substrate SUB from penetrating into the pixel PX(3, i) during subsequent processes.

In addition, the diffusion prevention layer DPL may be formed of lead (Pb), nickel (Ni), tin (Sn), iron (Fe), or silver (Ag). The diffusion prevention layer DPL may include metal oxides of the above-mentioned metals and metals reduced from the metal oxides. In other words, the metal oxides includes lead oxide (PbO), nickel oxide (NIO), tin oxide (SnO2), iron oxide (Fe2O3), and silver oxide (AgO).

Then, the buffer layer BFL may be formed on the diffusion prevention layer DPL (S40). The buffer layer BFL may improve the adhesive force of the first semiconductor pattern AL1 and the second semiconductor pattern AL2.

In accordance with one exemplary embodiment, the buffer layer BFL may include at least one of silicon oxide or silicon nitride. The buffer layer BFL may include thin film layers. Further, the buffer layer BFL may include a silicon oxide layer and a silicon nitride layer, which are alternately stacked on each other. The buffer layer BFL is formed by any suitable method, for instance, the chemical vapor deposition method, the heat deposition method, or the sputtering method.

The buffer layer BFL may include the same material as that of the barrier layer BRL. In accordance with one exemplary embodiment, the barrier layer BRL, which is used to block foreign substances, has a thickness TH1 larger than a thickness TH2 of the buffer layer BFL. The thickness TH1 of the barrier layer BRL is about 400 nm to 1000 nm. The thickness TH2 of buffer layer BFL is about 400 nm to 800 nm. The buffer layer BFL has the thickness TH2 smaller than the thickness TH1 of the barrier layer BRL since the buffer layer BFL is used to cover the diffusion prevention layer DPL. In addition, it may be beneficial that the buffer layer BFL has a relatively small thickness in order to reduce the amount of hydrogen decomposed from the buffer layer BFL.

The buffer layer BFL including at least one of silicon oxide or silicon nitride may have an influence on the structure of the diffusion prevention layer DPL since the metal oxide of the diffusion prevention layer DPL may be reduced by the hydrogen decomposed from the buffer layer BFL.

Figure 9:
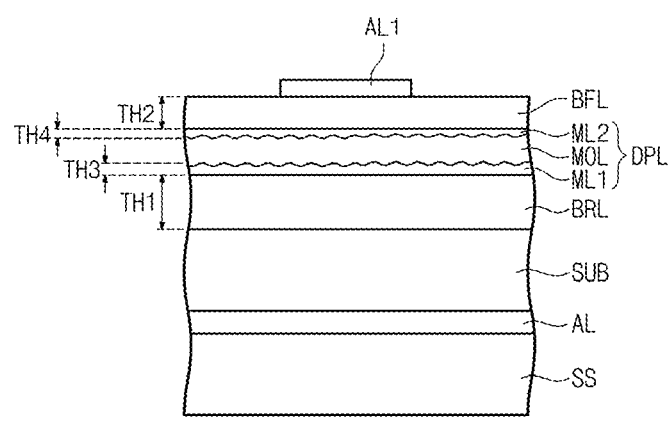
FIG. 9 is a partially enlarged view showing a portion of the pixels shown in FIG. 5.

In other words, the diffusion prevention layer DPL disposed under the buffer layer BFL may include two metal layers ML1 and ML2 and a metal oxide layer MOL disposed between the two metal layers ML1 and ML2, as seen in FIG. 9. Between the two metal layers ML1 and ML2, the metal layer disposed closer to the barrier layer BRL, e.g., metal layer ML1, has a larger average thickness TH3 than the average thickness TH4 of the other metal layer, e.g., metal layer ML2.

Then, the gate lines G1 to Gn (referring to FIG. 1), the data lines D1 to Dm (referring to FIG. 1), and the pixels PX(1, 1) to PX(n, m) (referring to FIG. 1) are formed on the buffer layer BFL (S50). The gate lines G1 to Gn, the data lines D1 to Dm, and the pixels PX(1, 1) to PX(n, m) are formed by the manufacturing method of an organic light emitting display panel, which includes a deposition process, a photolithography process, etc.

The plastic substrate SUB is separated from the sacrificial substrate after the gate lines G1 to Gn, the data lines D1 to Dm, and the pixels PX(1, 1) to PX(n, m) are formed on the buffer layer BFL (S60). For example, the plastic substrate SUB is separated from the surface of the sacrificial substrate SUB using a delamination process. The adhesive layer AL is separated from the plastic substrate SUB with the sacrificial substrate SUB.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display panel, the method comprising:
   disposing a flexible substrate on a sacrificial substrate;
   forming a barrier layer on the flexible substrate;
   forming a diffusion prevention layer on the barrier layer, the diffusion prevention layer comprising a metal oxide and a metal reduced from the metal oxide; and
   forming a buffer layer on the diffusion prevention layer, wherein formation of the diffusion prevention layer causes, at least in part, hydrogen from the barrier layer to be combined with oxygen from the metal oxide, the combination being discharged as vapor and the metal being reduced from the metal oxide.

2. The method of claim 1, wherein:

the metal oxide comprises at least one of copper oxide (CuO), lead oxide (PbO), nickel oxide (NiO), tin oxide ($SnO_2$), iron oxide ($Fe_2O_3$), and silver oxide (AgO); and the metal comprises at least one of copper (Cu), lead (Pb), nickel (Ni), tin (Sn), iron (Fe), and silver (Ag).

3. The method of claim 1, wherein a concentration of the metal increases in a direction toward the barrier layer.

4. The method of claim 1, wherein the barrier layer comprises at least one of silicon oxide and silicon nitride.

5. The method of claim 4, wherein the buffer layer comprises the same material as the barrier layer.

6. The method of claim 1, further comprising:

separating the flexible substrate from the sacrificial substrate.

7. The method of claim 1, wherein a thickness of the buffer layer is less than a thickness of the barrier layer.

8. The method of claim 1, wherein the flexible substrate comprises polyimide.

* * * * *